US007025855B2

(12) United States Patent
Sago et al.

(10) Patent No.: US 7,025,855 B2
(45) Date of Patent: Apr. 11, 2006

(54) INSULATION-FILM ETCHING SYSTEM

(75) Inventors: Yasumi Sago, Tokyo (JP); Yoneichi Ogahara, Tokyo (JP); Masanori Miyamae, Tokyo (JP)

(73) Assignee: Anelva Corporation, Tokyo (JP)

( * ) Notice: Subject to any disclaimer, the term of this patent is extended or adjusted under 35 U.S.C. 154(b) by 292 days.

(21) Appl. No.: 10/310,685

(22) Filed: Dec. 4, 2002

(65) Prior Publication Data

US 2003/0159779 A1 Aug. 28, 2003

(30) Foreign Application Priority Data

Dec. 4, 2001 (JP) .............................. 2001-370771

(51) Int. Cl.
*H01L 21/3065* (2006.01)
(52) U.S. Cl. .......................... 156/345.37; 156/345.29; 156/345.47
(58) Field of Classification Search ................................
156/345.24–345.29, 345.43, 345.47; 216/59, 216/67, 74; 134/1.1–1.3; 438/710–716; 118/715, 724, 723 E
See application file for complete search history.

(56) References Cited

U.S. PATENT DOCUMENTS

| 4,624,214 | A | * | 11/1986 | Suzuki et al. ................ 118/719 |
| 5,064,520 | A | * | 11/1991 | Miyake et al. .......... 204/192.11 |
| 5,474,647 | A | * | 12/1995 | Poultney et al. ................ 438/5 |
| 5,622,918 | A | * | 4/1997 | Nakamura ................... 505/473 |
| 5,685,942 | A | * | 11/1997 | Ishii ........................ 156/345.48 |
| 5,709,757 | A | * | 1/1998 | Hatano et al. ............. 134/22.14 |
| 5,711,813 | A | * | 1/1998 | Kadoiwa et al. ....... 118/723 VE |
| 6,318,384 | B1 | * | 11/2001 | Khan et al. ................. 134/22.1 |
| 6,403,491 | B1 | * | 6/2002 | Liu et al. ..................... 438/710 |
| 6,649,021 | B1 | * | 11/2003 | Ohmoto et al. ......... 156/345.43 |
| 2002/0117472 | A1 | * | 8/2002 | Sun et al ....................... 216/68 |
| 2003/0159779 | A1 | * | 8/2003 | Sago et al. ............. 156/345.24 |

FOREIGN PATENT DOCUMENTS

| JP | 55-046576 | * | 4/1980 |
| JP | 59-050179 | | 3/1984 |
| JP | 05-243190 | | 9/1993 |
| JP | 06-310588 | | 11/1994 |
| JP | 07-331462 | | 12/1995 |
| JP | 08-176828 | | 7/1996 |
| JP | 08-288267 | | 11/1996 |
| JP | 10-112457 | | 4/1998 |

(Continued)

OTHER PUBLICATIONS

Machine translation of JP 05-243190.*

(Continued)

*Primary Examiner*—Jeffrie R. Lund
(74) *Attorney, Agent, or Firm*—Hogan & Hartson, L.L.P.

(57) ABSTRACT

This application discloses an insulation-film etching system that etches an insulator film on a substrate by a species produced in plasma. The apparatus comprises a process chamber in which the etching process is carried out, a substrate holder that is provided in the process chamber and holds the substrate, a gas introduction line to introduce a gas having an etching function into the process chamber, a plasma generator to generate the plasma of the introduced gas, and a transfer mechanism to transfer the substrate into the process chamber and to transfer the substrate out of the process chamber. The gas introduction line is capable of introducing a gas having a cleaning function to remove a deposited film on an exposed surface in the process chamber, instead of the gas for the etching. The system comprises a control unit that carries out the sequence control. According as the sequence control, the cleaning is carried out after the etching.

12 Claims, 4 Drawing Sheets

FOREIGN PATENT DOCUMENTS

| | | |
|---|---|---|
| JP | 10-144498 | 5/1998 |
| JP | 10-154696 | 6/1998 |
| JP | 10-178003 | 6/1998 |
| JP | 11-040502 | 2/1999 |
| JP | 11-121436 | 4/1999 |
| JP | 11-186226 | 7/1999 |
| JP | 11-233487 | 8/1999 |
| JP | 11-340215 | 12/1999 |

OTHER PUBLICATIONS

Machine translation of JP 06-310588.*

* cited by examiner

INSULATION-FILM ETCHING SYSTEM

BACKGROUND OF THE INVENTION

1. Field of the Invention

This invention relates to an insulation-film etching system that etches an insulation-film on a substrate.

2. Description of the Related Art

Surface processes onto a substrate are widely practical in manufacturing such electronic devices as LSIs (Large-Scale Integrated circuits) and LCDs (Liquid Crystal Displays). Among them, a process to etch an insulation-film on a substrate is one of key processes in micro-circuit formation. For example, a coated resist is patterned on an insulation-film such as silicon oxide film or silicon nitride film covering a silicon wafer. The insulation-film is etched using the patterned resist as "mask". Then, a micro-circuit is formed by burying metal such as tungsten or aluminum into the etched parts. Though the term "substrate" means a board-shaped base for a product, one composed of a board-shaped base and any layer or film formed is sometimes called "substrate" as a whole in this specification.

Dry etching utilizing plasma is popular among insulation-film etching systems. In this type of system, a gas is introduced into a process chamber, and plasma is generated by a HF (High-Frequency) discharge. The introduced gas is reactive one such as CHF3 so that the RIE (Reactive Ion Etching) can be carried out by function of activated or ionized species produced in the plasma. Though "HF" usually means frequencies ranging from 3 MHz to 30 MHz, "HF" in this specification broadly means frequencies higher than MF (Medium Frequency, 300 kHz to 3000 kHz), including VHF (Very High Frequency, 30 MHz to 300 MHz) and UHF (Ultra High Frequency, 300 MHz to 3000 MHz).

At the background that higher function, larger-scale integration and higher performance are consistently required to electronic devices as products, requirement to etching systems has become severer and severer. Especially, higher cleanness of atmosphere in process chambers is more severely required at the background that circuits are made finer and finer. In this respect, what matters in insulation-film etching systems is film deposition in process chambers, which is caused from a gas used for etching. This point will be described as follows, taking the silicon-oxide-film etching as an example.

In the silicon-oxide-film etching, plasma is generated of a fluorohydrocarbon gas such as CHF3. Fluorine decomposing in the fluorohydrocarbon plasma reacts with silicon, producing volatile SiF4. The etching is carried out as the silicon oxide film is transformed to volatile material by such the reaction. In this type of the etching utilizing a fluorohydrocarbon gas, however, a carbon-series film might be easily deposited on an exposed surface in the process chamber during the etching under the influence of unreacting or undecomposing species. The film deposition might also take place from a residual gas after the etching. The deposited film in the etching using such a fluorohydrocarbon gas is polymer composed of fluorine, carbon and hydrogen.

The film deposited on the exposed surface in the process chamber may peel off from its internal stress or weight. When this happens, particles of some extent size are released. If the particles are attached on the substrate to be processed, critical defects such as breaking or short of the circuit may take place. In addition, when the particles are attached on a substrate holder, there arises the problem that contact of the substrate onto the substrate holder becomes worse in the next etching. At worse contact of the substrate onto the substrate holder, the temperature of the substrate may be unstable or out of uniform during the etching, leading to deterioration of the etching property.

Particularly at the background of recent demand to further enhance integration levels and functions of products, some gases having various functions are often mixed. The mixed gases tend to promote the film depositions. On the other hand, amount of released particles, which affect the etching processes, are required to be as small as possible. In a sense, severe requirements conflicting to each other are subjected to the etching systems.

SUMMARY OF THE INVENTION

The invention of this application is to solve the above-described subjects, and to present an insulation-film etching system of high performance where the particle attachment to a substrate is effectively prevented. Concretely, this invention presents an insulation-film etching system that etches an insulator film on a substrate by a species produced in plasma, comprising a process chamber in which the etching process is carried out, a substrate holder that is provided in the process chamber and holds the substrate, a gas introduction line to introduce a gas having an etching function into the process chamber, a plasma generator to generate the plasma of the introduced gas, and a transfer mechanism to transfer the substrate into the process chamber and to transfer the substrate out of the process chamber. The process chamber comprises a pumping line to pump itself. The gas introduction line is capable of introducing a gas having a cleaning function to remove a deposited film on an exposed surface in the process chamber, instead of the gas for the etching. The system comprises a control unit that controls the pumping line, the gas introduction line, the plasma generator and the transfer mechanism. The control unit carries out the sequence control where; after the etching, the process chamber is pumped by the pumping line and the substrate is transferred out of the process chamber by the transfer mechanism, the gas having the cleaning function is introduced into the process chamber by the gas introduction line, then the plasma of the gas is generated by the plasma generator.

DETAILED DESCRIPTION OF THE PREFERRED EMBODIMENTS

Figure 1:
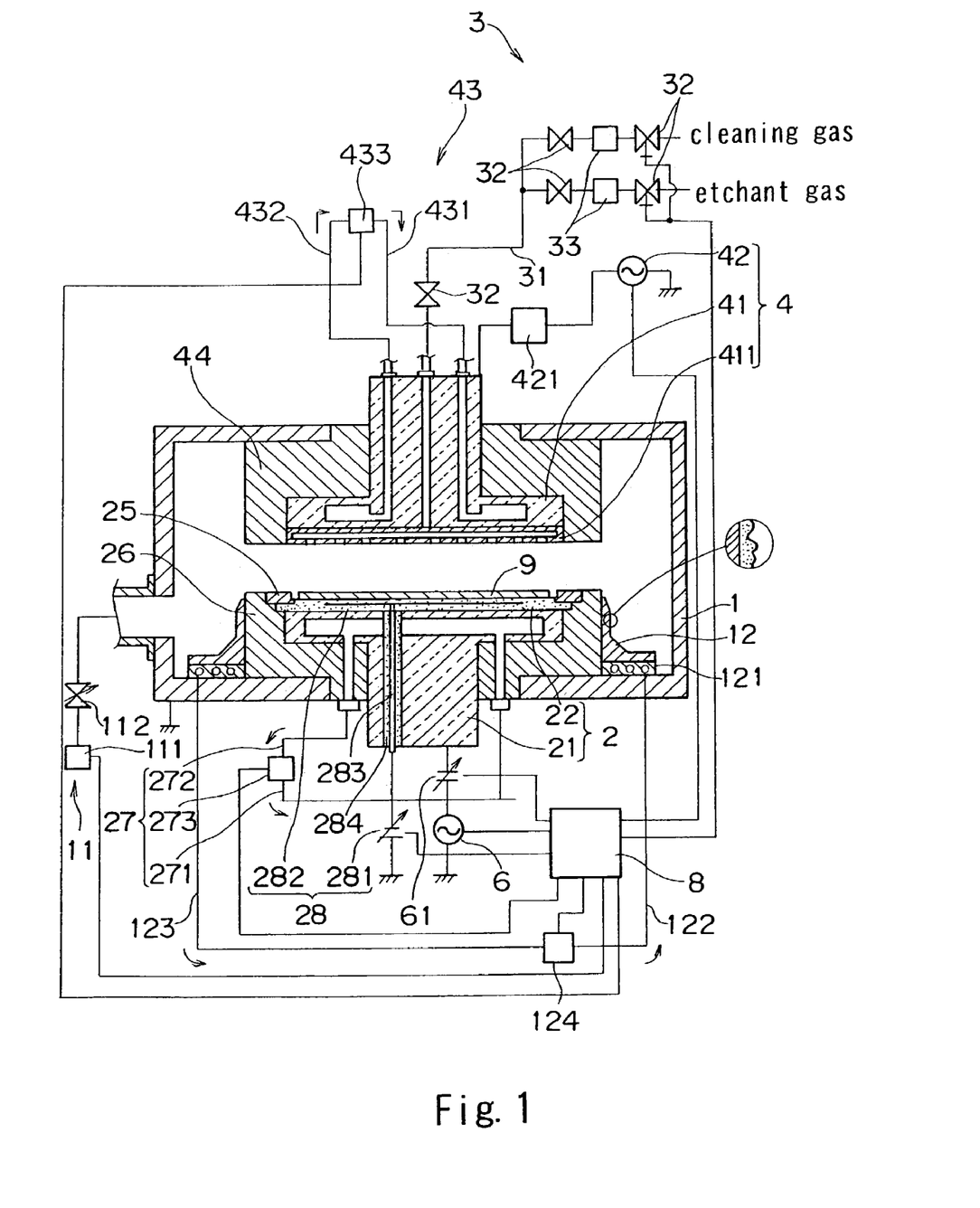
FIG. 1 is a schematic front cross-sectional view of the main part of an insulation-film etching system as the preferred embodiment of the invention.

The preferred embodiments of this invention are described as follows. FIG. 1 is a schematic front cross-sectional view of the main part of an insulation-film etching system as the preferred embodiment of the invention. The system shown in FIG. 1 comprises a process chamber 1 in which an etching process is carried out onto a substrate 9, a substrate holder 2 that is provided in the process chamber 1 and holds the substrate 9, a gas introduction line 3 to introduce a gas having an etching function into the process chamber 1, a plasma generator 4 to generate plasma of the introduced gas, and a transfer mechanism to transfer the substrate into the process chamber 1 and to transfer the substrate out of the process chamber 1.

The process chamber 1 is the air-tight vacuum chamber. The process chamber 1 is formed of metal such as stainless-steel and electrically grounded. A pumping line 11 is provided with the process chamber 1. The pumping line 11 comprises a vacuum pump 111 such as a dry pump and a pumping-speed controller 112 so that it can pump the process chamber 1 at a vacuum pressure ranging from 10–3 to 10 Pa.

The substrate holder 2 is composed of a main member 21, holding block 22 provided in contact with the main member 21, and other components. The main member 21 is formed metal such as aluminum or stainless-steel. The holding block 22 is formed of dielectric such as alumina. The substrate 9 is held on the top of the holding block 22.

An electrostatic-chucking mechanism 28 for chucking the substrate 9 is provided with the substrate holder 2. The electrostatic-chucking mechanism 28 comprises a chucking electrode 282 provided in the holding block 22 and a chucking source 281 for applying a negative voltage to the chucking electrode 282.

An insulation tube 284 is provided in the substrate holder 2. The insulation tube 284 reaches the holding block 22, penetrating the main member 21. A conducting member 283 is inserted in the insulator tube 284. One end of the conducting member 283 is connected with the chucking electrode 282. The other end of the conducting member 283 is connected with the chucking source 281. The chucking electrode 282 is dispensable in case whole the main member 21 works as a chucking electrode.

The holding block 22 has a convex shape in cross section as a whole, having a step at the periphery. The surface on which the substrate is held, hereinafter called "holding surface", is the surface of the area inside the step. The correction ring 25 is provided on the peripheral step. The correction ring 25 is made of the same or similar material as the substrate 9, for example silicon mono-crystal.

Gas consumption and products in the reaction during the etching over the area outside the substrate 9 differ from those over the substrate 9. Therefore, components of the plasma over the area outside the substrate 9 differ from those over the substrate 9. This sometimes may cause fluctuation of the etching property at the periphery on the substrate 9. The correction ring 25 is provided to correct such the non-uniformity of the etching property at the periphery.

The correction ring 25 is cooled by a cooling mechanism 27, described later, as well as the substrate 9. The temperature of the correction ring 25 is kept the same as the substrate 9 by the cooling mechanism 27. As a result, the correction ring 25 provides heat with the substrate 9 to compensate heat dissipating from the edge of the substrate 9, preventing the temperature drop at the periphery on the substrate 9. Non-uniformity of the temperature brings non-uniformity of the species production, which leads to non-uniformity of the etching property. The correction ring 25 prevents such the non-uniformities as well.

The substrate holder 2 comprises a heat-transfer-gas introduction line (not shown) that introduces a heat-transfer-gas between the holding surface and the substrate 9. Helium is adopted as the heat-transfer-gas. The substrate holder 2 is mounted at the bottom of the process chamber 1, interposing an insulation block 26. The insulation block 26, which is made of insulator such as alumina, insulates the main member 21 from the process chamber 1 and protects the main member 21 from the plasma. For preventing leakage of vacuum, vacuum seals such as O-rings are provided between the substrate holder 2 and the insulation block 26, and between the process chamber 1 and the insulation block 26.

The substrate holder 2 comprises the cooling mechanism 27. The cooling mechanism 27 circulates a coolant through a cavity provided in the main member 21. The cooling mechanism 27 is composed of a coolant feeding pipe 271 to feed the coolant to the cavity, a coolant drainage pipe 272 to drain the coolant out of the cavity, a pump or circulator 273 for feeding and draining the coolant, and other components. Fluorinert (trademark) of 3M Corporation is used as the coolant. The coolant is cooled at 20 to 80° C. so that whole the substrate holder 2 can be cooled at 20 to 80° C. during the etching. As a result, the substrate 9 is cooled at a temperature ranging from 70 to 130° C. during the etching.

The gas introduced by the introduction line 3 for the etching, which is hereinafter called "etchant gas", is fluorocarbon or fluorohydrocarbon gas such as C4F8, CF4 or CHF3. Argon or oxygen is mixed or used substitutively. The gas introduction line 3 is composed of a gas cylinder (not shown), a feeding pipe 31 interconnecting the gas cylinder and the process chamber 1, a valve 32 and a gas-flow controller 33 both provided at the feeding pipe 31, and other components.

The plasma generator 4 is to generate the plasma by HF discharge of the introduced gas. The plasma generator 4 is composed of an opposite electrode 41 facing to the substrate holder 2, an HF power source 42 to apply an HF voltage to the opposite electrode 41, and other components. The opposite electrode 41 and the substrate holder 2 compose co-called parallel-planar-electrodes structure. The discharged space between the opposite electrode 41 and the substrate holder 2 inductively couples the HF circuit by the HF power source 42. In short, the plasma generator 4 generates the inductively-coupled-type plasma.

The opposite electrode 41 is hanged from the upper wall of the process chamber 1. The opposite electrode 41 is fitted air-tightly through the upper wall, interposing the insulation block 44. The opposite electrode 41 is commonly used for a route for introducing the etchant gas by the gas introduction line 3. Concretely as shown in FIG. 1, a front board 411 is fixed with the opposite electrode 41 at the front. The front board 411 is hollow and has gas effusion holes at the side facing to the substrate holder 2. The etchant gas introduced by the gas introduction line 3 is temporarily stored in the front board 411, and effused through the gas effusion holes. Output frequency of the HF power source 42 is in the range from 10 MHz to 600 MHz. Output power of the HF power source 42 can be varied from 0 to 5 kW. A matching circuit 421 is provided between the opposite electrode 41 and the HF power source 42 for impedance matching.

Another cooling mechanism 43 is provided with the opposite electrode 41. The cooling mechanism 43 is to circulate a coolant through a cavity provided in the opposite electrode 41. The cooling mechanism 43 is composed of a coolant feeding pipe 431 to feed the coolant to the cavity, a coolant drainage pipe 432 to drain the coolant out of the cavity, a pump or circulator 433 for feeding and draining the coolant, and other components. Fluorinert cooled at 20 to 80° C. is used as the coolant as well for cooling the opposite electrode 41 at 90 to 150° C. during the etching.

The system of this embodiment comprises a biasing power source 6. The biasing power source 6 is to generate so-called self-biasing voltage at the substrate 9 by applying an HF voltage to the substrate holder 2. The self-biasing voltage extracts ions from the plasma and makes them incident on the substrate 9. The biasing power source 6 is the HF source of which output frequency is in the range from 400 kHz to 13.56 MHz, and output power is in the range from 0 to 5 KW. A variable capacitor 61 is provided between the biasing power source 6 and the substrate holder 2. A matching circuit (not shown) is provided between the biasing power source 6 and the substrate holder 2. The variable capacitor 61 is occasionally a component of the matching circuit.

Figure 2:
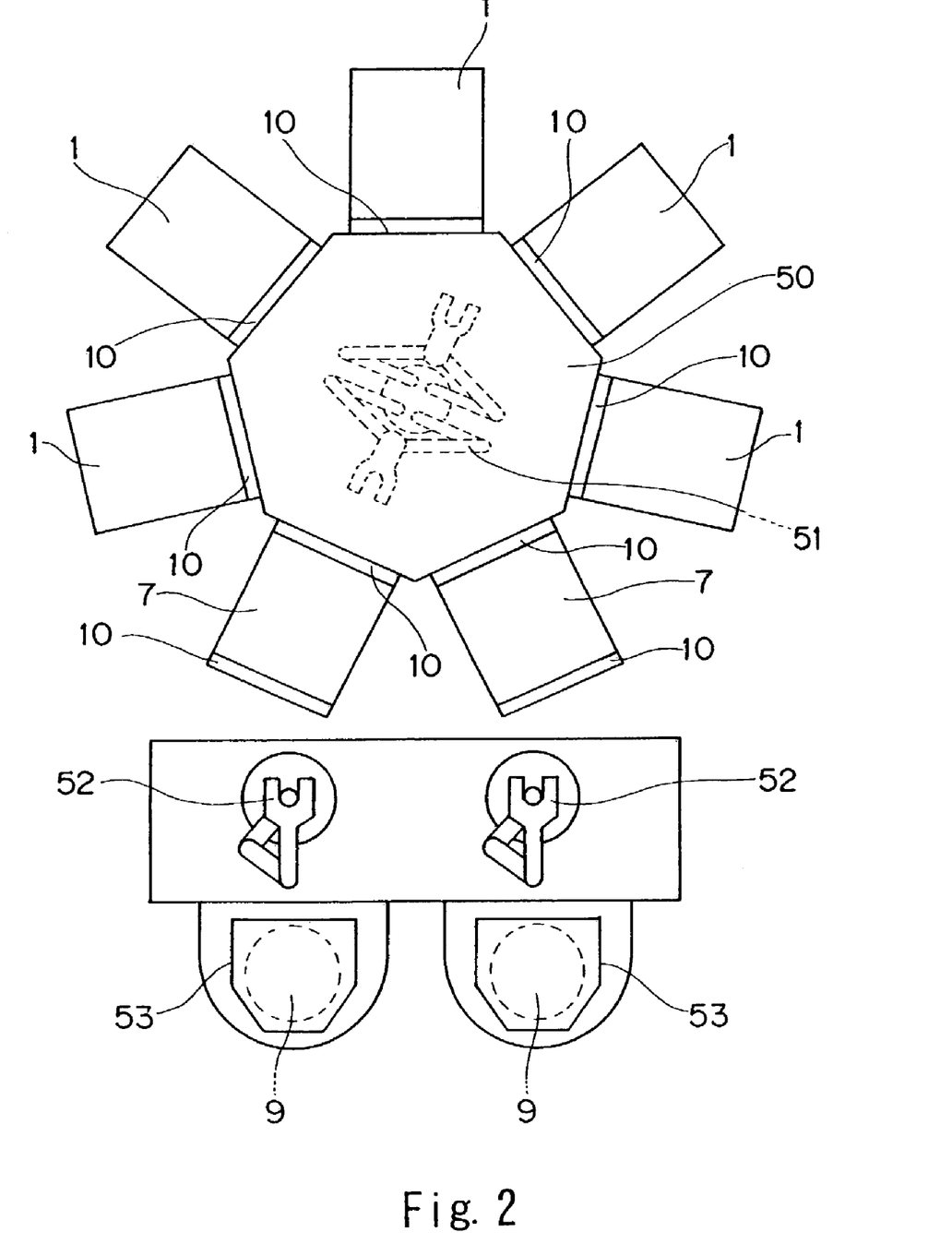
FIG. 2 is a schematic whole plane view of the system shown in FIG. 1.

In state the plasma is generated in the process chamber 1, when the HF voltage is applied to the substrate 9 via capacitance, surface potential of the substrate 9 varies as negative direct voltage is superposed over the HF voltage. This negative direct voltage is called "self-biasing voltage". The self-biasing voltage applies the field having the gradient from the plasma toward the substrate 9. Ions in the plasma is extracted and made incident on the substrate 9 efficiently. FIG. 2 is a schematic whole plane view of the system shown in FIG. 1. As shown in FIG. 2, the system of this embodiment has the chamber layout where a transfer chamber 50 is provided at the center, and the process chambers 1 and load-lock chambers 7 are provided at the periphery. Gate-valves 10 are provided between the chambers 1, 7, 50. The same etching processes are sometimes carried out in a multiplicity of the process chambers 1 show in FIG. 2. Otherwise, a process before or after the etching is sometimes carried out in one of the process chambers 1.

As the transfer mechanism, an articulated robot 51 is employed. The robot 51, hereinafter "transfer robot", holds the substrate 9 at the top of the arm, and transfers it to a required position by the expansion-retraction motion, the rotation around the vertical axis, and the lift-up-and-down motion of the arm.

The transfer robot 51 is provided at the center in the transfer chamber 50. The unprocessed substrate 9 is transferred to the load-lock chamber 7 from the outside atmosphere. The transfer robot 51 takes the unprocessed substrate 9 out of the load-lock chamber 7, and transfers it to the process chamber 1. The transfer robot 51 places the substrate 9 on the substrate holder 2 in the process chamber 1. After finishing the etching, the transfer robot 51 picks up the substrate 9 from the substrate holder 2, and returns it to the load-lock chamber 7. An auto-loader 52 is provided outside the load-lock chamber 7, i.e. at the atmosphere. The auto-loader 52 transfers the unprocessed substrate 9 from a cassette 53 at the atmosphere into the load-lock chamber 7, and transfers the processed substrate 9 out of the load-lock chamber 7 to the cassette 53.

As show in FIG. 1, a control unit 8 is provided for controlling each component of the system. The control unit 8 controls the pumping line 11, the gas introduction line 3, the electrostatic-chucking mechanism 28, the HF power source 42, the biasing power source 6, the cooling mechanism 27, the transfer mechanism, and other components. One of the points characterizing this embodiment is that the system is capable of cleaning to remove a film deposited on an exposed surface in the process chamber 1 during the etching. This point will be described in detail as follows.

The gas introduction line 3 can introduce a gas having the function of the cleaning, hereinafter called "cleaning gas", in addition to the described etchant gas. Oxygen is employed as the cleaning gas in this embodiment. The gas introduction line 3 selectively introduces the etchant gas or the cleaning gas by operations of the valves 32 according to the control signal from the control unit 8.

The cleaning is carried out by generating plasma of the introduced oxygen gas. The oxygen-gas plasma is generated by the HF discharge as well as for the etching. The HF power source 42 is commonly used for the cleaning. Oxygen ions and activated oxygen species are produced profusely in the oxygen-gas plasma generated by the HF power source 42. A film deposited on an exposed surface is removed by arrival of the produced ions or activated species.

Concretely, the system of this embodiment is supposed to etch a silicon oxide film by the etchant gas of fluorohydrocarbon as described. Therefore, main components of the deposited film are carbon and hydrocarbon. Oxygen ions and activated oxygen species react with those components, producing volatile substances such as carbon dioxide and water vapor. The volatile substances are exhausted out of the process chamber 1 through the pumping line 11.

Figure 3:
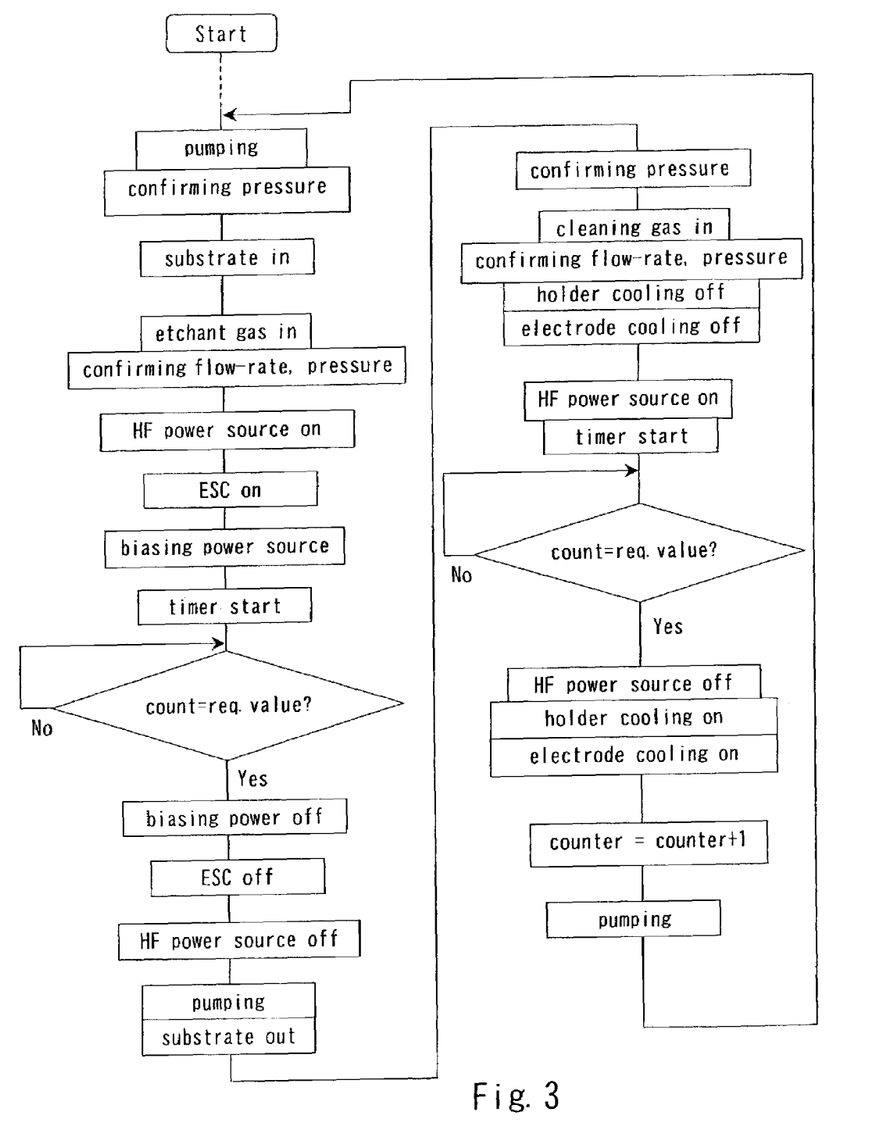
FIG. 3 is a flow chart schematically showing a sequence-control program provided with the control unit 8.

The control unit 8 comprises a sequence-control program for carrying out control of each part of the system, including the optimum control for the cleaning. FIG. 3 is a flow chart schematically showing the sequence-control program provided with the control unit 8. The sequence-control program installed with the control unit 8 will be described referring to FIG. 3. The following description corresponds to an operation of the system.

At the initial step of the sequence-control program, each chamber 1, 7, 50 is pumped by each pumping line. After confirming the pressure in each chamber 1, 7, 50 is maintained at a require value, the sequence-control program operates the transfer mechanism to transfer the first substrate 9 to the process chamber 9 and place it on the substrate holder 2. At the next step of the sequence-control program, the chucking mechanism 28 is operated to chuck the substrate 9 on the substrate holder 2, and the gas introduction line 3 is operated to introduce the etchant gas into the process chamber 1 at a required flow-rate. After confirming the pressure in the process chamber 1 and the flow-rate of the etchant gas are kept at required values, the HF power source 42 is operated to generate plasma, and the biasing power source 6 is operated. As a result, ions and activated species in the plasma function to etch the insulation film on the substrate 9. The cooling mechanisms 27, 43 are continuously operated to cool the substrate holder 2 and the opposite electrode 41 during the etching.

When the etching is started, the sequence-control program begins counting by a timer. When the counted number reaches a required value, the operations of the biasing power source 6, the electrostatic-chucking mechanism 28 and the HF power source 42 are stopped. And, the etchant gas introduction by the gas introduction line 3 is also stopped, then, the process chamber 1 is pumped by the pumping line 11 again. Afterward, the sequence-control program controls the transfer mechanism to transfer the substrate 9 out of the process chamber 1 and return it to the load-lock chamber 7.

Next, the sequence-control program carries out the control for the cleaning. Concretely, the pumping system 11 is operated to pump the process chamber 1 again. After confirming the process chamber 1 is pumped at a required pressure, a control signal is sent to the gas introduction line 3 to switch the valves 32, thereby introducing oxygen gas. After confirming the oxygen-gas flow rate and the pressure in the process chamber 1 are maintained at required values, the sequence-control program operates the HF power source 42 to generate plasma. As a result, the deposited film is removed by the function of the plasma as described. At almost the same time when the operation of the HF power source 42 begins, the sequence-control program suspends the operations of the cooling mechanisms 27, 43, i.e. stopping circulations of the coolant.

With the start of the cleaning, the sequence-control program begins counting by the timer. When the counting reaches a required number, operation of the HF power source 42 is stopped. Simultaneously, operation of the gas introduction line 3 is stopped. Then, operations of the cooling mechanisms 27, 43 are resumed.

Afterward, the sequence-control program carries out the control for preparing the process onto the next substrate 9. The pumping line 11 is operated again to pump the process chamber 1. After confirming the pressure in the process chamber 1, the transfer mechanism is controlled to transfer the next substrate 9 into the process chamber 1. Subsequent steps for the next etching are the same as described. After finishing the etching, the sequence-control program adds one with a processed-piece counter and renews it.

As described, the by-piece etching processes are carried out onto the substrates 9 as the cleaning is carried out after every etching process. In this embodiment, the cassette 53 stores twenty-five substrates 9. With the finish of the etching process onto the twenty-fifth substrate 9, the processes of one lot are completed. In this embodiment, before processes of the next lot, the cleaning is carried out additionally. Not shown in FIG. 3, when the processed-piece counter counts twenty-five, the sequence-control program controls each part to carry out the cleaning one more time before the first substrate 9 of the next lot is transferred into the process chamber 1.

Also not shown in FIG. 3, when the initial operation of the system is started, the cleaning is carried out as well before the process of the first lot begins. After all, the system of this embodiment carries out the cleaning in every interval between the processes and in every interval of between the lots. The control unit 8 is the computer comprising a CPU, a memory, a hard-disk and other components. The described sequence-control program, which is installed with the hard-disk, is read out and executed by the CPU for the operation of the system.

The described system of this embodiment has the following technical advantages. First of all, because a deposited film is removed by the cleaning, particle generation resulting from that the film peels off is suppressed. Therefore, faults such as circuit defects caused by particles attached on the substrate 9 can be prevented effectively. In addition, the system is free from the problem that the temperature of the substrate 9 becomes unstable in the next etching by particles attached on the holding surface. Especially in case that a heat-transfer gas such as helium is introduced between the substrate 9 and the holding surface, it is required to confine the heat-transfer gas at the interface. If particles are attached on the holding surface, confinement of the heat-transfer gas would be impossible. However, such the confinement error can be prevented as well in this embodiment. Specifically, when the cleaning is carried out under the condition:

HF power source 42; 60 MHz, 1.5 kW
cleaning gas; oxygen, 100 sccm flow rate
pressure in the process chamber 1; 5 Pa, the number of attached particles having diameter of 0.2 μm or more can be stably suppressed below twenty. "SCCM" stands for Standard Cubic-Centimeter per Minute, which means gas flow rate converted at 0° C., 1 atm.

The described effect is enhanced in this embodiment because the cleaning is carried out after every process onto every substrate 9. The effect is enhanced furthermore, because the cleaning is carried out after completing the processes for every lot. If any deposited film cannot be removed completely in the cleaning after every etching process for every substrate, the residual film grows to be thick as the processed-piece number increases. Accordingly, the additional cleaning is preferably carried out after finishing the processes for every lot, thereby removing the residual film completely. In case that the residual film is not so thick after every etching process for every substrate 9, the cleaning may be less frequent. For example, the cleaning may be carried out after the etching processes of the several times, otherwise the cleaning may be carried out only after finishing the etching processes for every lot.

Wet-cleaning of the process chamber 1 is occasionally carried out after the long-term operation of the system. In such the case, required time for the wet-cleaning is remarkably reduced by carrying out the cleaning as described. Showing one example, even the system that requires the wet-cleaning after the two hundred hours operation, the required time for the wet-cleaning is less than three hours, contributing to the total operation efficiency of the system.

One significant point in the described sequence-control program is that the cooling mechanisms 27,43 are not operated during the cleaning, though those are operated during the etching. This brings the advantage of the cleaning efficiency enhancement, which enables to reduce the time for the cleaning. To cool the substrate holder 2 during the etching is to prevent the substrate 9 from being heated excessively by the plasma. To cool the opposite electrode 41 during the etching is to prevent thermal damage of it as well. On the other hand in the cleaning, no substrate 9 is on the substrate holder 2, and the required time is shorter than the cleaning. And, the cleaning is more efficient at a higher temperature because it utilized the reactions of oxygen ions and activated oxygen species. Therefore, the operations of the cooling mechanisms 27,43 are suspended during the cleaning so that the temperatures of the substrate holder 2 and the opposite electrode 4 can be higher than during the etching. Though thick films are deposited on the surfaces of the substrate holder 2, the correction ring 25 and the opposite electrode 41, those are exposed to hot-temperature oxygen ions and activated oxygen species, thereby being removed rapidly. Complete suspensions of the cooling mechanisms 27,43 are not always required. Those may be operated at reduced performances, i.e. keeping the coolants at higher temperatures or reducing the circulation volume of the coolants.

Another significant point in the described sequence-control program is that the biasing source 6 is not operated during the etching. This point brings the advantage of the substrate holder protection, i.e. preventing ions from being incident on the substrate holder 4 excessively during the cleaning. As described, the biasing power source 6 has the function to enhance the etching efficiency by extracting ions from the plasma and making them incident on the substrate 9. However, if the biasing power source 6 is operated during the cleaning, the holding surface of the substrate holder 2 might be damaged by incident ions extracted excessively from the plasma, because of no substrate 9 on it. Therefore, the biasing power source 6 is not operated during the cleaning. Still, the biasing power source 6 is occasionally operated to some extent, because a film is deposited on another surface than the holding surface. Even in this case, the self-biasing voltage on the surface of the substrate holder 2 is made smaller than in the etching, so that the thermal damage of the holding surface can be prevented. Though it is difficult to define the range of the self-biasing voltage where the holding surface does not suffer the damage because it depends on factors such as the pressure in the process chamber 1, the self-biasing voltage ranging from 0 to 100V is preferable in the pressure range from 1 to 100 Pa that is practical in the cleaning.

Some improvements are provided with the system to avoid the productivity drop, although it carries out the described cleaning additionally. This point will be described as follows. As a means for avoiding the productivity drop, the system comprises a cold trap 12 for depositing a film positively. The cold trap 12 is provided at a level lower than the substrate 9. Concretely, the cold trap 12 is provided on the side of the substrate holder 2 as shown in FIG. 1. The system comprises a coolant block 121 as a member to cool the cold trap 12. The coolant bock 121 is the member directly cooled by a coolant circulated through itself. The coolant block 121 is ring-shaped, surrounding the bottom of the substrate holder 2. The system further comprises a coolant feeding pipe 122 to feed the coolant into a cavity of the coolant block 121, a coolant drainage pipe 123 to drain the coolant out of the cavity, and a pump or circulator for feeding and draining the coolant. A thermostat (not shown) is provided to cool again the drained coolant at a required temperature.

The cold trap 12 is cylindrical and surrounds the substrate holder 2. The cold trap 12 has a flange at the bottom as shown in FIG. 1. The cold trap 12 is fixed by screwing against the coolant block 121, being in good thermal contact with the coolant block 121. A thin sheet (not shown), for example a carbon sheet, is inserted at the interface of the cold trap 12 and the coolant block 121 to enhance the thermal contact. The surfaces of the cold trap 12 and the coolant block 121 are not completely flat, being slightly rough. Therefore, micro-spaces are formed at the interface. The heat transfer efficiency is poor at those spaces because those are at vacuum pressures. The sheet fills those spaces, thereby enhancing the heat transfer efficiency.

Fluorinert or Galden (registered trademark) of Ausimont S.p.A. in Italy is adopted as the coolant. By feeding such the coolant kept at 20 to 80° C., the cold trap 12 is cooled at 40 to 100° C. during the etching. Though the compulsory cooling of the cold trap 12 is necessarily carried out at least during the etching, the cold trap 12 may be cooled continuously all the time of the system operation.

The film deposition tends to take place at an exposed surface of a comparatively low temperature in the process chamber 1. This is because unreacting or undecomposing species, which have the function of the film deposition, are deprived of their energy and captured at the low-temperature surfaces. At high-temperature surfaces, contrarily, because those species having the depositing function can maintain their high-energy states, they are not captured, being released to travel again in the process chamber 1.

In the system of this embodiment, a large amount of the species having the depositing function are collected at the cold trap 12, growing to form a film. Therefore, amount of film depositions on other surfaces in the process chamber 1 is reduced in exchange. Accordingly, amount of the film depositions in one-time etching, which includes the film deposition by the residual gas, is reduced, compared to the case the cold trap 12 is not provided. This means that the cleaning may be less frequent. In other words, the system of this embodiment has the advantage that the productivity would not drop, although the cleaning steps are interposed for the high-quality etching with the reduced particle-generation.

Because the film grows to be thick on the surface of the cold trap 12, the cold trap 12 is replaced after the etching is repeated at some extent times. The process chamber 1 is separable. In replacing the cold trap 12, after venting the process chamber 1 to the atmospheric pressure and separate it, the cold trap 12 is demounted from the coolant block 121. Then, a new cold trap 12 or a cold trap 12 on which the deposited film is removed is mounted.

In this embodiment, the coolant is not circulated through the cold trap 12, but through the coolant block 121 with which the cold trap 12 is mounted in replaceable state. If the coolant is circulated directly through the cold trap 12, the complete drainage of the coolant from the cold trap 12 is required in replacing it. However, such the troublesome work is not required in this embodiment.

As magnified in FIG. 1, the surface of the cold trap 12 is made rough. This roughness is to prevent the deposited film from peeling off. A film deposited on a flat surface might easily peel off. The film deposited on such the rough surface is hard to peel off, because it is tied into the concaves of the rough surface. Such the roughness is formed by, for example, the flame-spray-coating of alumina. Otherwise, it is formed by the sandblasting. Concretely, after roughing an aluminum-made-surface by the sandblasting, the alumite treatment is carried out onto the roughened surface.

Anyway, the surface of the cold trap 12 is preferably oxide or insulator. This is because the deposited film is often organic in relevance to the kind of the etchant gas. Organic films are hard to peel off on oxide- or insulator-made-surfaces because they have higher affinity with oxide or insulator, compared to metal such as aluminum or stain-less steel. Therefore, the fluoride-resin coating may be provided on the cold trap 12. The bodies of the cold trap 12 and the coolant block 121 are made of metal such as aluminum, stain-less steel or cupper, considering the heat-transfer efficiency.

The point that the cold trap 12 is provided at the level lower than the substrate 9 is in consideration of the case that particles would be released from the cold trap 12. Though the film deposition on the cold trap 12 is suppressed as described, no probability of the deposited film to peel off is impractical. If the deposited film might peel off from the cold trap 12 in case that the tarp 12 is located at a level higher than the substrate 9, particles produced from the peeling film would fall and be attached on the substrate 9 with the high probability. Considering the route for pumping by the pumping line 11, the cold trap 12 is preferably provided at a position closer to the exhaust slot on the wall of the process chamber 1 than to the substrate 9. This is to enhance the possibility that the particles do not reach the substrate 9 but are exhausted through the pumping line 11 even if the film on the cold trap 12 peels off. As shown in FIG. 1, the system of this embodiment satisfies this point.

In addition, some improvements to enhance the effect of the cleaning are provided with this embodiment, concerning to the plasma generation. As described, the problem that a peeling film gives rise to is the production of particles that are attached on the substrate 9. Accordingly, films deposited at places closer to the substrate 9 have higher probabilities to give rise to the problem. In this embodiment, films deposited on the correction ring 25 and other members nearby correspond to such. On the other hand, the effect of the cleaning is brought by the function of oxygen ions and activated oxygen species in the plasma. Taking these points into consideration, the plasma density is preferably made higher at the space region facing to the periphery of the substrate or the area surrounding the substrate 9.

Figure 4:
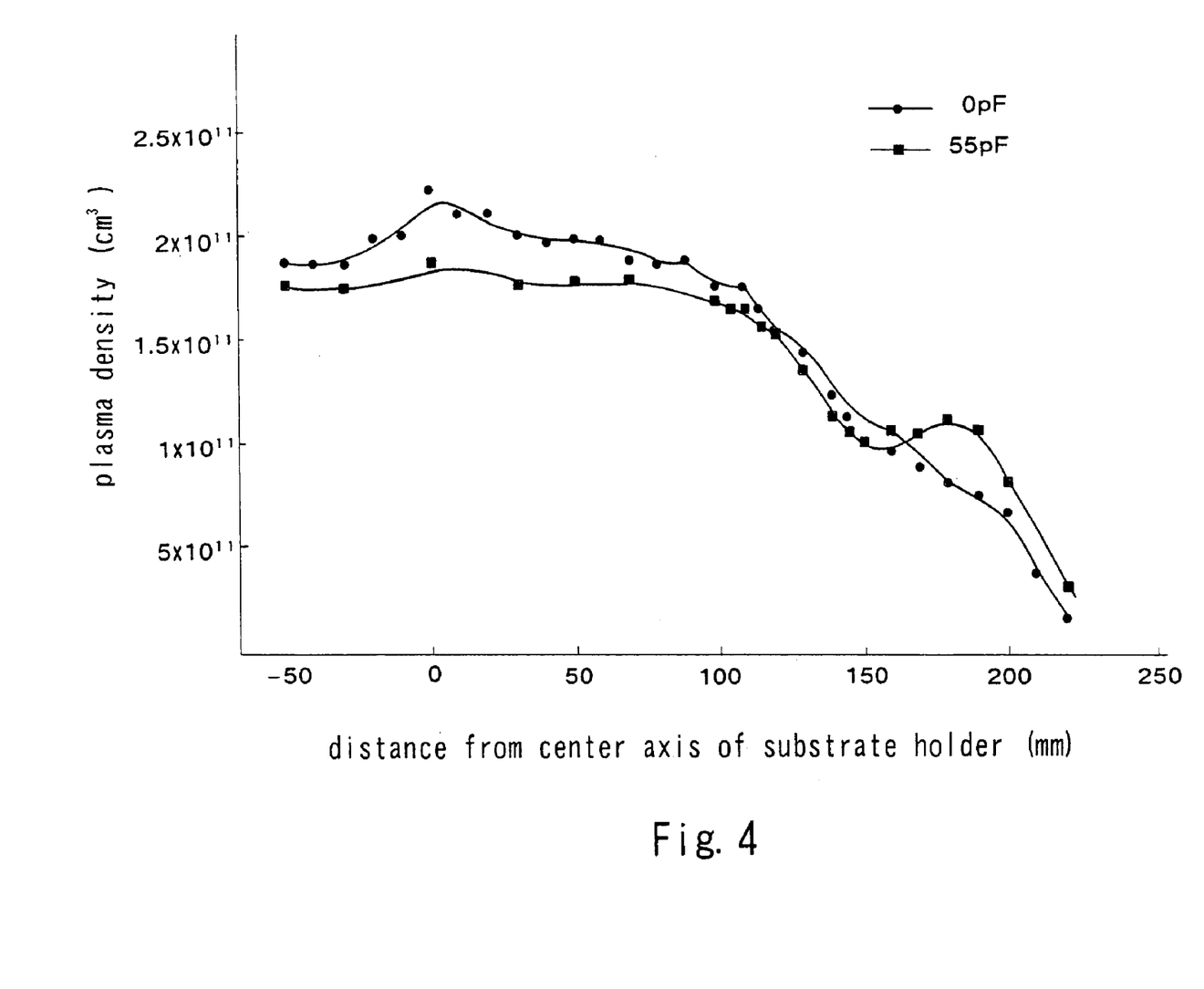
FIG. 4 shows the result of an experiment for confirming the coordination of the plasma density distribution.

From the research by the inventors, it was turned out that plasma density distribution can be coordinated by varying capacitance of a capacitor provided between one of the electrodes and a power source in the discharge structure of the inductively-coupled parallel-planar-electrodes type as in this embodiment. FIG. 4 shows the result of an experiment for confirming the coordination of plasma density distribution. This experiment was carried out under the following condition.

HF power source 42: 60 MHz, 1.8 kW
Biasing power source 6: 1.6 MHZ, 1.8 kW
Pressure in the process chamber 1: 3.3 Pa
Introduced gas: oxygen, 100 sccm flow rate The biasing power source 6 was operated for the biasing voltage lower than in the etching. The reason of this is as described. The transverse axis in FIG. 4 corresponds to positions along a direction parallel to the electrode in the discharge space, the ordinate axis corresponds to the plasma density, i.e. number density of electrons or ions. Data designated by ● are in case that the capacitance of the variable capacitor 61 is 0 pF, and data designated by ■ are in case of about 55 pF. Even at zero capacitance of the variable capacitor 61, some capacitance exists between the substrate 9 and the ground, i.e. stray capacitance and capacitance of the holding block 22. As shown in FIG. 4, the plasma density is prominently high at the periphery in case that the capacitance of the variable capacitor was about 55 pF, compared to 0 pF.

Considering these points, the system comprises the variable capacitor 61 so that capacitance can be coordinated to obtain a desired plasma-density distribution. The value of the capacitance that brings the plasma-density prominence at the periphery depends on factors such as the pressure in the process chamber 1, and the output power and the frequency of the HF power source 42. Therefore, it is practical to experimentally find in advance the value of capacitance where the plasma-density prominence is observed under an optimum cleaning condition. Then, the control unit 8 carries out the control so that the found value of capacitance can be realized in the cleaning. Namely, the control unit 8 controls the variable capacitor 61 individually at the time of the etching and at the time of the cleaning. It is also practical to provide a variable capacitor between the HF power source 42 and the opposite electrode 41 and control it. In fact, the capacitance of 55 pF is employed as the one for establishing the resonance at the frequency of the HF power source 42 between the substrate holder 2 and a grounded member below it. However, the establishment of the resonance is not always required for the described plasma-density prominence at the periphery.

In the described insulator-film etching system, for the protection of the substrate holder 2 it is also preferable to place a covering member, which has the same size and the same shape as the substrate, on the substrate holder 2 during the cleaning. The covering member is on standby in a chamber such as the load-lock chamber 7 during the etching. In starting the cleaning, the transfer mechanism transfers the covering member into the process chamber 1 and places it on the substrate holder 2 in the same way as the substrate 9. This brings the merit that the self-biasing voltage can be increased for extracting ions as many as in the etching without the problem because the holding surface is protected. The covering member is required not to release contaminants. Concretely, the covering member is formed of material that is not etched by the plasma, or material that does not give rise to the problem of contamination, for example silicon or carbon. Insulation films etched by the system of this invention is not are not limited to the described silicon oxide film and silicon nitride film. As the cleaning gas, it is possible to adopt another gas such as N2, H2, NH3, H2O, CF4 or CHF3.

What is claimed is:

1. An insulation-film etching system that etches an insulation film on a substrate by a species produced in plasma, comprising:
   a process chamber in which the etching process is carried out;
   a substrate holder that is provided in the process chamber and holds the substrate;
   a gas introduction line to introduce a gas having etching function into the process chamber;
   a plasma generator to generate plasma of the introduced gas;
   a transfer mechanism to transfer the substrate into the process chamber and transfer the substrate out of the process chamber; and
   a compulsorily-cooled cold trap for capturing a species having depositing function;
   wherein
   the process chamber comprises a pumping line to pump the process chamber;
   the plasma generator comprises an opposite electrode facing the substrate holder and forming a discharge space therebetween;
   the gas introduction line is capable of introducing a gas having cleaning function to remove a deposited film on an exposed surface in the process chamber, instead of the gas for the etching;
   a control unit connected to the pumping line, the gas introduction line, the plasma generator and the transfer mechanism is provided;
   the control unit carries out the sequence control where;
   after the etching, the process chamber is pumped by the pumping line,
   the substrate is transferred out of the process chamber by the transfer mechanism,
   the gas having the cleaning function is introduced into the process chamber by the gas introduction line and,
   then plasma of the gas is generated by the plasma generator;
   the cold trap is provided at a level lower than the substrate;
   the cold trap is ring-shaped and surrounds the substrate holder;
   a space between the cold trap and a wall of the process chamber is open;
   an exhaust slot is provided on the wall of the process chamber; and
   the exhaust slot is located where the discharge space between the substrate holder and the opposite electrode is evacuated through the open space between the cold trap and the wall of the process chamber.

2. An insulation-etching system as claimed in claim 1, wherein:
   the cold trap captures the species having depositing function to make a larger amount of a film deposit on the surface, compared to other places in the process chamber.

3. An insulation-film etching system as claimed in claim 1, wherein;
   roughness is provided on the surface of the cold trap for preventing the deposited film from peeling off,
   the surface of the cold trap is made of oxide or insulator.

4. An insulation-film etching system as claimed in claim 1, wherein;
   the cold trap is provided at a position closer to the exhaust slot on the wall of the process chamber than to the substrate.

5. An insulation-film etching system as claimed in claim 1, wherein;
a cooling mechanism to cool the substrate holder by circulating coolant through the substrate holder is provided,
the control unit controls the cooling mechanism to make the temperature of the substrate holder during the cleaning higher than during the etching.

6. An insulation-film etching system as claimed in claim 1, wherein:
the plasma generator further comprises a High-Frequency power source to apply a High-Frequency voltage to the opposite electrode;
a cooling mechanism that cools the opposite electrode by circulating a coolant through the opposite electrode is provided;
a control unit controls the cooling mechanism to make the temperature of the opposite electrode during the cleaning higher than during the etching.

7. An insulation-film etching system as claimed in claim 1, wherein:
the plasma generator further comprises a High-Frequency power source to apply a High-Frequency voltage to the opposite electrode;
a biasing power source is connected with the substrate holder;
the biasing power source applies a High-Frequency voltage to the substrate holder for generating a self-biasing voltage, which extracts ions from the plasma and makes them incident on the substrate;
a variable capacitor is provided between the substrate holder and the biasing power source;
the control unit controls the variable capacitor to make the plasma density higher during the cleaning at the periphery of the discharge space between the substrate holder and the opposite electrode than during the etching.

8. An insulation-film etching system as claimed in claim 1, wherein:
the plasma generator further comprises a High-Frequency power source to apply a High-Frequency voltage to the opposite electrode;
a biasing power source is connected with the substrate holder;
the biasing power source applies a High-Frequency voltage to the substrate holder for generating a self-biasing voltage, which extracts ions from the plasma and makes them incident on the substrate;
a variable capacitor is provided between the opposite electrode and the High-Frequency power source;
the control unit controls the variable capacitor to make the plasma density higher during the cleaning at the periphery of the discharge space between the substrate holder and the opposite electrode than during the etching.

9. An insulation-film etching system as claimed in claim 1, wherein:
the plasma generator further comprises a High-Frequency power source to apply a High-Frequency voltage to the opposite electrode;
a biasing power source is connected with the substrate holder;
the biasing power source applies a High-Frequency voltage to the substrate holder for generating a self-biasing voltage, which extracts ions from the plasma and makes them incident on the substrate;
the control unit operates the biasing power source during the etching, and does not operate the biasing power source during the cleaning.

10. An insulation-film etching system as claimed in claim 1, wherein:
the plasma generator further comprises a High-Frequency power source to apply High-Frequency voltage to the opposite electrode;
a biasing power source is connected with the substrate holder;
the biasing power source applies a High-Frequency voltage to the substrate holder for generating a self-biasing voltage, which extracts ions from the plasma and makes them incident on the substrate;
during the cleaning the control unit operates the biasing power source to generate the self-biasing voltage lower than during the etching.

11. An insulation-film etching system as claimed in claim 1, wherein
the sequence control by the control unit is that the cleaning is carried out every time after a process of the etching is carried out onto a piece of the substrate.

12. An insulation-film etching system as claimed in claim 11, wherein
the sequence control by the control unit is that the cleaning is carried out every time after processes of the etching are carried out onto one lot of the substrates.

* * * * *